(12) United States Patent
Chen (10) Patent No.: US 11,811,000 B2
(45) Date of Patent: Nov. 7, 2023

(54) METHODS FOR FORMING LIGHT EMITTING DIODES

(71) Applicant: Applied Materials, Inc., Santa Clara, CA (US)

(72) Inventor: Taichou Papo Chen, San Jose, CA (US)

(73) Assignee: APPLIED MATERIALS, INC., Santa Clara, CA (US)

( * ) Notice: Subject to any disclaimer, the term of this patent is extended or adjusted under 35 U.S.C. 154(b) by 274 days.

(21) Appl. No.: 17/137,586

(22) Filed: Dec. 30, 2020

(65) Prior Publication Data

US 2022/0209061 A1 Jun. 30, 2022

(51) Int. Cl.
| | | |
|---|---|---|
| *H01L 33/24* | (2010.01) | |
| *H01L 33/12* | (2010.01) | |
| *H01L 33/00* | (2010.01) | |
| *H01L 33/46* | (2010.01) | |

(52) U.S. Cl.
CPC ............ *H01L 33/12* (2013.01); *H01L 33/005* (2013.01); *H01L 33/24* (2013.01); *H01L 33/46* (2013.01); *H01L 2933/0025* (2013.01)

(58) Field of Classification Search
CPC ......... H01L 25/0753; H01L 2933/0025; H01L 33/005; H01L 33/12; H01L 33/24; H01L 33/44; H01L 33/46; H01L 33/62
See application file for complete search history.

(56) References Cited

U.S. PATENT DOCUMENTS

| | | |
|---|---|---|
| 7,192,797 B2 | 3/2007 | Tu et al. |
| 8,931,906 B2 | 1/2015 | Huang et al. |
| 10,170,671 B2 | 1/2019 | Chu |
| 2010/0032700 A1* | 2/2010 | Yu ............................ H01L 33/48 |
| | | 257/E33.001 |
| 2011/0175055 A1* | 7/2011 | Pan .......................... H01L 33/24 |
| | | 257/14 |

(Continued)

FOREIGN PATENT DOCUMENTS

| | | |
|---|---|---|
| CN | 111415926 A | 7/2020 |
| KR | 10-1020424 B1 | 3/2011 |

OTHER PUBLICATIONS

International Search Report for PCT/US2021/064846, dated Apr. 12, 2022.

*Primary Examiner* — Julia Slutsker
*Assistant Examiner* — Dmitriy Yemelyanov
(74) *Attorney, Agent, or Firm* — MOSER TABOADA (57) ABSTRACT

Methods for forming light emitting diodes (LEDs) that leverage cavity profiles and induced stresses to alter emitted wavelengths of the LEDs. In some embodiments, the method includes forming a cavity on a substrate where the cavity has a cavity profile that is configured to accept an emitter pixel structure for an LED, forming at least one passivation layer in the cavity, and forming at least one optical layer in the cavity on at least a portion of one of the at least one passivation layer. The at least one optical layer is configured to increase a lumen output of the emitter pixel structure. The method further includes forming the emitter pixel structure in the cavity on the at least one optical layer of the emitter pixel structure where the cavity profile is configured to adjust an emitted light wavelength of the emitter pixel structure.

20 Claims, 8 Drawing Sheets

(56) References Cited

U.S. PATENT DOCUMENTS

| | | | |
|---|---|---|---|
| 2012/0171797 A1* | 7/2012 | Kang | C30B 29/406 |
| | | | 438/47 |
| 2012/0205617 A1* | 8/2012 | Pan | H01L 33/32 |
| | | | 257/13 |
| 2015/0115293 A1 | 4/2015 | Wu et al. | |
| 2015/0340346 A1 | 11/2015 | Chu et al. | |
| 2017/0263822 A1* | 9/2017 | Chou | H01L 33/12 |
| 2018/0294254 A1 | 10/2018 | Chen et al. | |
| 2019/0181188 A1 | 6/2019 | Youn et al. | |
| 2021/0119075 A1* | 4/2021 | Charles | H01L 33/20 |

* cited by examiner

METHODS FOR FORMING LIGHT EMITTING DIODES

FIELD

Embodiments of the present principles generally relate to semiconductor manufacturing.

BACKGROUND

Light emitting diodes (LEDs) can be used for many applications. One popular application is to use LEDs as display pixels to generate images by altering the emitted frequency or wavelength of the pixel. To increase the resolution of the image, the pixel sizes must be reduced while increasing pixel performance. With decreased dimensions, the typical manufacturing processes are unable to keep up with the increased demands on display resolutions. Accordingly, the inventor has provided methods for forming emitters or display pixels that dramatically increase the manufacturing throughput and are compatible with more workflows such as complementary metal oxide semiconductor (CMOS) workflows, leading to substantially reduced manufacturing costs and superior performance.

SUMMARY

Methods for forming light emitting diodes (LEDs) are provided herein.

In some embodiments, a method for forming a light emitting diode (LED) may comprise forming a cavity on a substrate, the cavity having a cavity profile and configured to accept an emitter pixel structure of the LED, forming at least one passivation layer in the cavity, forming at least one optical layer in the cavity on at least a portion of one of the at least one passivation layer, wherein the at least one optical layer is configured to increase a lumen output of the emitter pixel structure, and forming the emitter pixel structure in the cavity on the at least one optical layer of the emitter pixel structure, wherein the cavity profile is configured to control stress on the emitter pixel structure by altering an electrical field or a work-function within the emitter pixel structure to increase carrier mobility and recombination efficiency and to adjust an emitted light wavelength of the emitter pixel structure.

In some embodiments, the method may further include forming a mold layer on the substrate and forming the cavity on the substrate by etching the cavity in the mold layer, forming the cavity on the substrate by etching the cavity into a substrate material, forming the emitter pixel structure using an atomic layer deposition (ALD) process, a chemical vapor deposition (CVD) process, or a molecular beam epitaxy (MBE) process and crystallizing the emitter pixel structure, wherein the at least one passivation layer or the at least one optical layer is conformally deposited into the cavity, wherein the at least one optical layer includes a distributed Bragg reflector (DBR) mirror layer, depositing a charge passivation layer in the cavity prior to forming the emitter pixel structure, the charge passivation layer configured to further adjust the emitted light wavelength, adjusting an amount of stress applied to the emitter pixel structure prior to or after formation of the emitter pixel structure in the cavity, wherein adjusting the amount of stress adjusts the emitted light wavelength of the emitter pixel structure, wherein the amount of stress is adjusted by placing at least one isolation structure external of the cavity of a material different from the substrate beside the cavity and wherein the amount of stress is further adjusted by differing material selections of the material different from the substrate for the external isolation structure, wherein the at least one isolation structure is at least one shallow trench isolation structure or at least one deep trench isolation structure gapfilled with the material different from the substrate, wherein the amount of stress is adjusted by curing processes, implanting dopants, or annealing processes prior to or after forming the emitter pixel structure, etching a bottom of the cavity to reveal substrate material and forming the emitter pixel structure in the cavity using an epitaxial growth process, and/or wherein the optical layer is formed of a metal material or dielectric material.

In some embodiments, a method for forming a light emitting diode (LED) may comprise forming a hardmask pattern on a substrate, forming at least one cavity on the substrate based on the hardmask pattern, the at least one cavity having a cavity profile and configured to accept an emitter pixel structure of the LED, removing the hardmask pattern from the substrate, forming at least one conformal passivation layer in the at least one cavity, forming at least one conformal optical layer in the at least one cavity on at least a portion of the at least one conformal passivation layer, wherein the at least one conformal optical layer is configured to increase a lumen output of the emitter pixel structure, and forming the emitter pixel structure in the at least one cavity on the at least one conformal optical layer of the emitter pixel structure.

In some embodiments, the method may further include forming the emitter pixel structure with different carrier injection or diffusion lengths and junction surface areas between electrons and holes or n-type and p-type, forming a mold layer on the substrate prior to forming the hardmask pattern and forming the at least one cavity into the mold layer or forming the at least one cavity by etching the substrate, forming the emitter pixel structure using an atomic layer deposition (ALD) process or a chemical vapor deposition (CVD) process, or a molecular beam epitaxy (MBE) and crystallizing the emitter pixel structure, adjusting an amount of stress applied to the emitter pixel structure by altering the cavity profile, wherein adjusting the amount of stress alters an emitted light wavelength of the emitter pixel structure or an electrical field or a work-function within the emitter pixel structure to increase carrier mobility and recombination efficiency, and/or forming a charge passivation layer prior to forming the emitter pixel structure, wherein the charge passivation layer is configured to alter an emitted light wavelength of the emitter pixel structure.

In some embodiments, a non-transitory, computer readable medium having instructions stored thereon that, when executed, cause a method for forming a light emitting diode (LED) to be performed, the method may comprise forming a cavity on a substrate, the cavity having a cavity profile and configured to accept an emitter pixel structure of the LED, forming at least one passivation layer in the cavity, forming at least one optical layer in the cavity on the at least one passivation layer, wherein the at least one optical layer is configured to increase a lumen output of the emitter pixel structure, and forming the emitter pixel structure in the cavity on the at least one optical layer of the emitter pixel structure.

Other and further embodiments are disclosed below.

BRIEF DESCRIPTION OF THE DRAWINGS

Embodiments of the present principles, briefly summarized above and discussed in greater detail below, can be understood by reference to the illustrative embodiments of the principles depicted in the appended drawings. However, the appended drawings illustrate only typical embodiments of the principles and are thus not to be considered limiting of scope, for the principles may admit to other equally effective embodiments.

To facilitate understanding, identical reference numerals have been used, where possible, to designate identical elements that are common to the figures. The figures are not drawn to scale and may be simplified for clarity. Elements and features of one embodiment may be beneficially incorporated in other embodiments without further recitation.

DETAILED DESCRIPTION

The methods enable formation of light emitting diodes (LEDs) such as emitters or display pixels and the like with simplified manufacturing workflows while improving the performance and scalability of the LEDs. The methods combine emitter material formation, composition engineering, surface passivation, work function engineering, and/or stress engineering all in one single workflow step or in integrated workflow steps. The methods allow homogeneous-materials or heterogeneous-materials device fabrications by integrating material engineering, device architecture, and device design. In comparison with conventional methods which require multiple steps, the methods have the potential to enable a new type of device structure with a highly simplified fabrication flow. The methods also have the advantages of reducing damage on device structures and materials during fabrication while addressing lattice mismatch, wafer bowing, and other issues for heterogeneous materials device fabrication. The methods combine mirror, filter, charge, work function, and/or isolation engineering methods in a single step or in simplified steps. The methods provide a new process of sensor quantum efficiency engineering and also enable integrating emitter and sensor on the same wafer. The methods of the present principles allow the introduction of new materials into the formation of the emitter structure, increasing performance and throughput at the same time. Moreover, cavity, stress, and charge engineering can be used as tuning knobs to infinitely adjust the emitted light wavelength of the LED.

Figure 11:
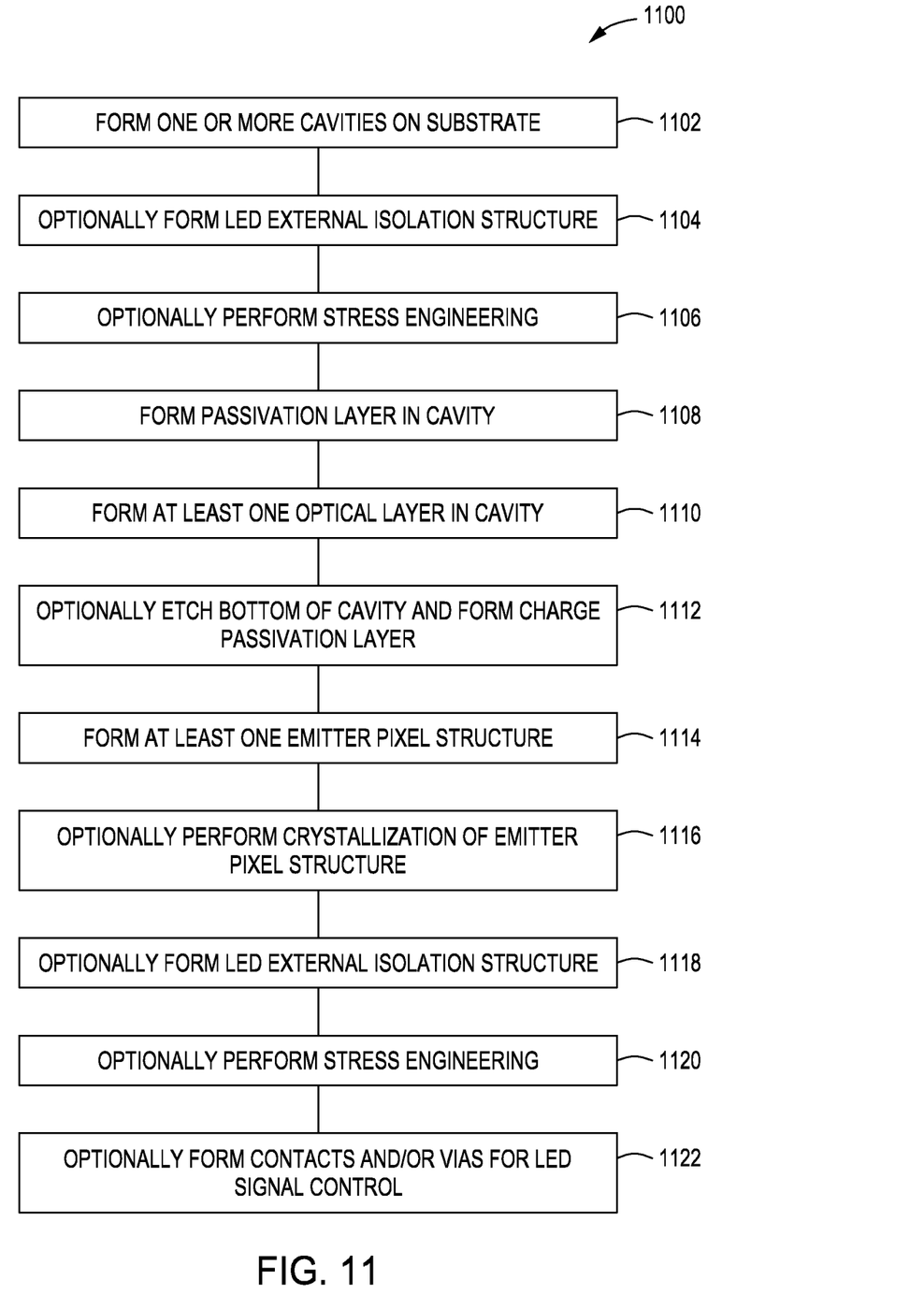
FIG. 11 is a method of forming a light emitting diode in accordance with some embodiments of the present principles.
Figure 12:
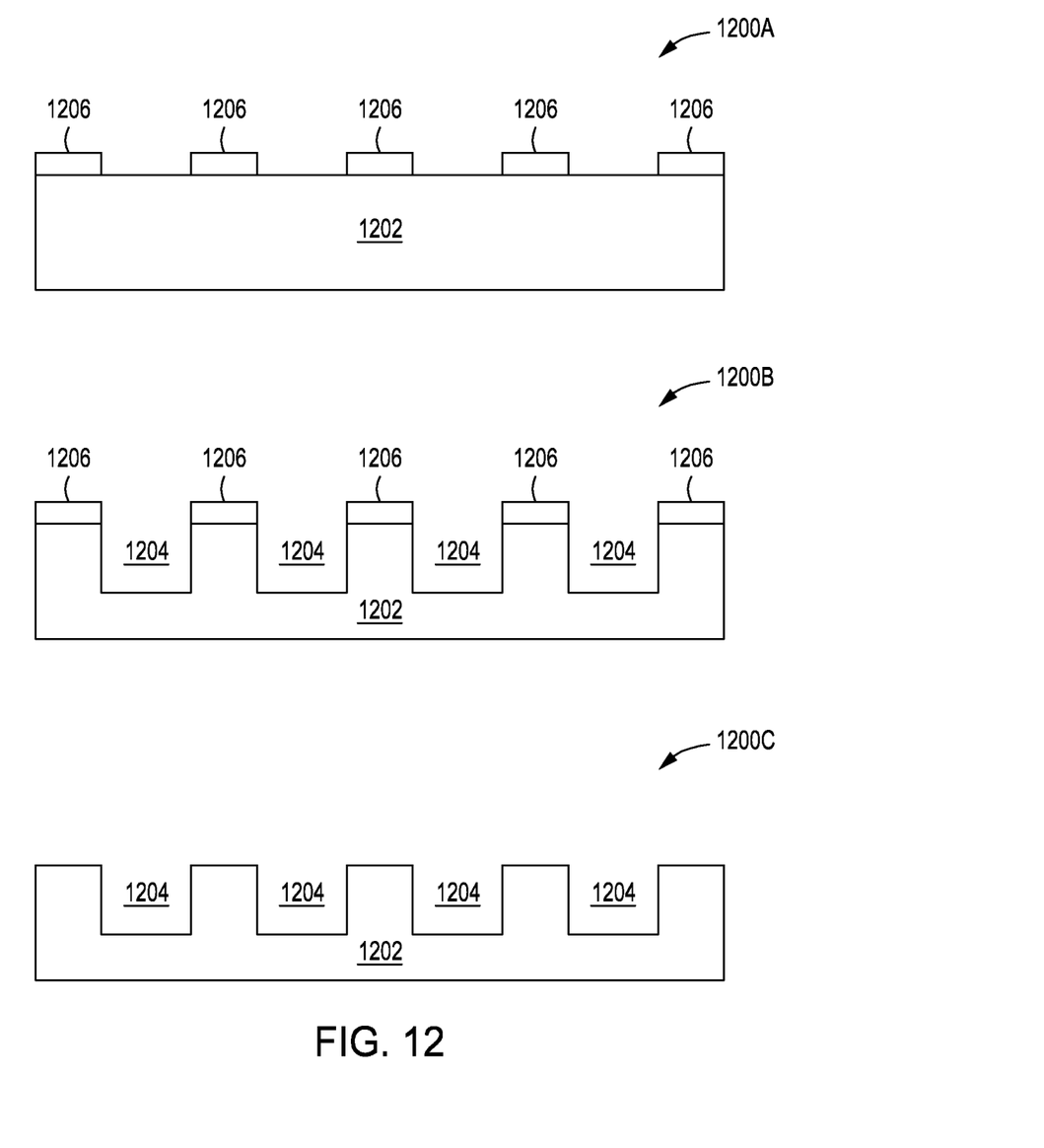
FIG. 12 depicts cavities formed in a substrate material in accordance with some embodiments of the present principles.
Figure 13:
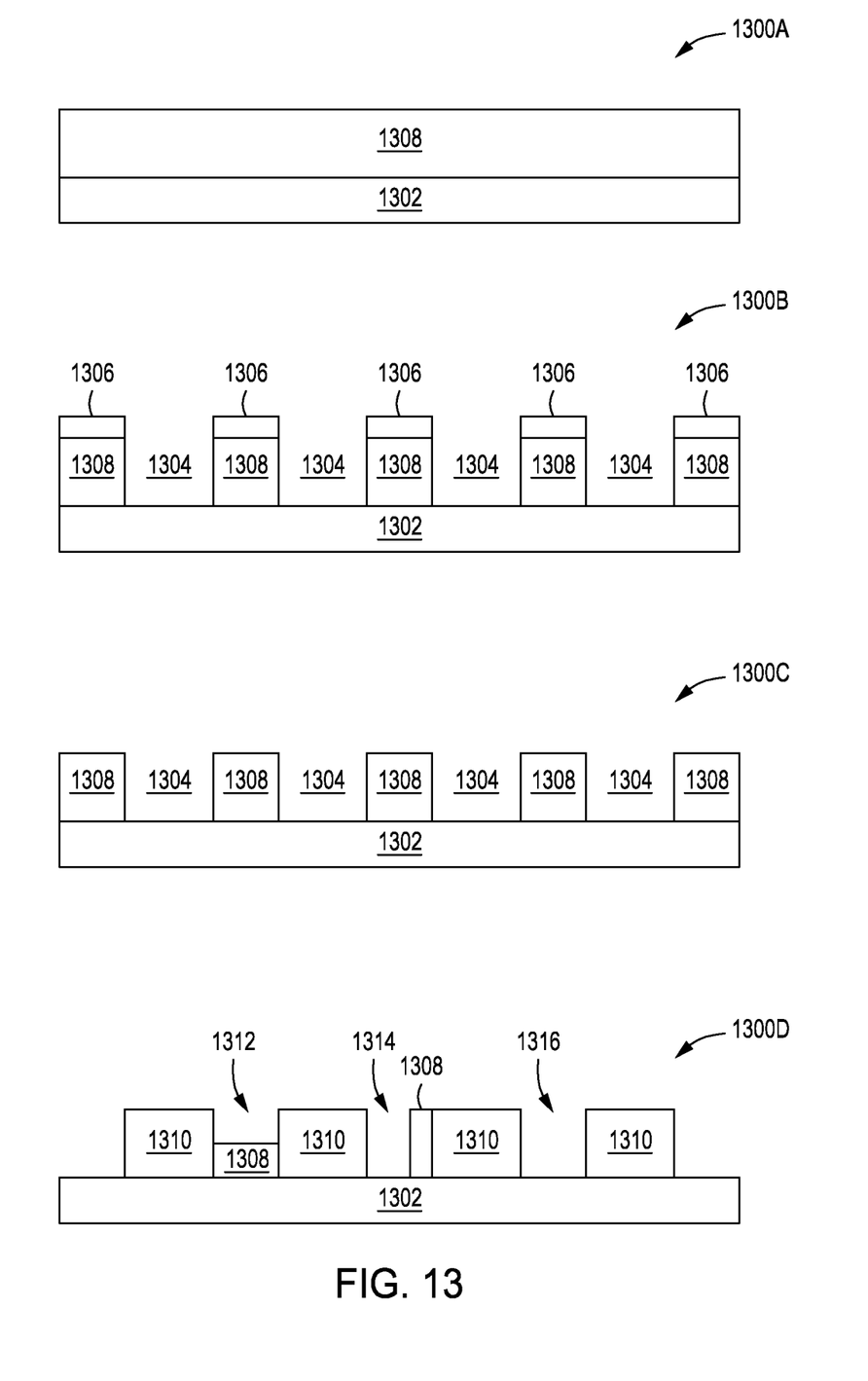
FIG. 13 depicts cavities formed in a mold layer on a substrate in accordance with some embodiments of the present principles.

An example method 1100 is depicted in FIG. 11 with reference to FIGS. 1-10, 12, and 13. In block 1102, one or more cavities are formed on a substrate. The phrase "formed on a substrate" as used herein includes cavities that are etched into the substrate material as well as cavities that are formed in a layer of mold material on an upper surface of the substrate. In some embodiments, the substrate may be a silicon-based material and the like. In some embodiments, the one or more cavities 1204 may be formed on the substrate 1202 by using a patterned hardmask 1206 as depicted in a view 1200A of FIG. 12. By using an etching process, the substrate 1202 is etched away and the one or more cavities 1204 are formed in the substrate 1202 as in a view 1200B of FIG. 12. The patterned hardmask 1206 is then removed leaving the one or more cavities 1204 in the substrate 1202 as depicted in a view 1200C of FIG. 12. The patterned hardmask 1206 can also be kept in support of selective deposition and removed after the emitter pixel structure formation. In some embodiments, the one or more cavities 1304 may be formed by first depositing a mold layer 1308 on the substrate 1302 as depicted in a view 1300A of FIG. 13. The mold layer 1308 may be formed of a dielectric or carbon-based material and the like. A patterned hardmask 1306 may then be applied on the mold layer 1308. The patterned hardmask 1306 and the mold layer 1308 can also be combined as one layer. An etching process is then used to form the one or more cavities 1304 in the mold layer 1308 on the substrate 1302 as depicted in a view 1300B of FIG. 13. The patterned hardmask 1306 is then removed leaving the one or more cavities 1304 on the substrate 1302 as depicted in a view 1300C of FIG. 13. In some embodiments, the mold layer 1308 may be removed after formation of the emitter pixel structures 1310 as depicted in view 1300D of FIG. 13 and as described below.

As depicted in FIGS. 1A-1D, cavity engineering can be used to shape the cavity based on a cavity profile that can influence an amount of stress acting on the emitter pixel structure that will be formed inside of the cavity 104A-104D. When a different material is formed inside the substrate material or inside the mold layer (herein the substrate material or the mold layer will be referred to as "the cavity layer" for the sake of brevity), stresses and strains will be induced on the different material due to lattice mismatches, stress memory effect (as found in the substrate material cavity or the mold layer cavity approach) and the cavity profile. Herein, "stress" is used to encompass both stresses and strains (compressive and tensile forces) for brevity. In view 100A, a cavity 104A formed in the cavity layer 102 has parallel walls 106A that may exhibit an even amount of stress and/or an electric field from a charge layer throughout the emitter pixel structure. In view 100B, a cavity 104B has angled walls 106B that are closer near a top 108B of the cavity 104B than at a bottom 110B of the cavity 104B that may exhibit an increased downward stress and/or work-function/electric-field from a charge layer on lower portions of the emitter pixel structure and increased inward stress and/or work-function/electric-field from a charge layer on upper portions of the emitter pixel structure. In view 100C, a cavity 104C has angled walls 106C that are closer near a bottom 110C of the cavity 104C than at a top 108C of the cavity 104C that may exhibit a decreased downward stress and/or work-function/electric-field from a charge layer on lower portions of the emitter pixel structure and decreased inward stress and/or work-function/electric-field from a charge layer on upper portions of the emitter pixel structure. In view 100D, a cavity 104D has inward angled walls 112D in an upper portion of the cavity 104D and outward angled walls 114D in a lower portion of the cavity 104D that may exhibit an increased inward stress and/or work-function/electric-field from a charge layer on the upper portion and a downward stress and/or work-function/electric-field from a charge layer on the lower portion that may be counteracted by the outward angled walls 114D. The cavity engineering can be used to influence stresses and/or work-functions/electric-fields from a charge layer on the pixel and structure and also to scale the emitter pixel structure. The cavity engineering can also be used to streamline the fabrication process by selecting and designing a cavity that requires less intensive processing. One skilled can also appreciate that stresses and/or work-functions/electric-fields from a charge layer within the emitter pixel structure are also impacted by isolation engineering (discussed below). The shape and angles of the walls of the cavity in conjunction with material selection and processing of external isolation structures near the cavity will influence the amount and location of stresses and/or work-functions/electric-fields within the cavity and both may be used to adjust the amount of stress. Shape and angles also enable three-dimensional stresses and/or work-function/electric-field engineering which will enhance quantum efficiency and modulate emission wavelength. The work-function/electric-field engineering of the cavity profile includes altering an electrical field or a work-function within the emitter pixel structure to increase carrier mobility and recombination efficiency and also to adjust an emitted light wavelength of the emitter pixel structure. The use of angled cavity surface examples is not meant to be limiting. One skilled in the art will also understand that the surfaces that form the cavity may be angled and/or curved.

In the following descriptions, a cavity having a cavity profile with parallel walls will be used for the sake of brevity, but the parallel walled cavity is not meant to be limiting in any manner. In block 1104, as shown in a view 800 of FIG. 8, at least one LED external isolation structure is optionally formed near the cavity 804 formed in a cavity layer 802. Herein, the term "external" is used for isolation structures that do not reside within the walls of the cavity. The external isolation structures 806 are used to adjust the amount of stress acting on the emitter pixel structure that will be formed within the cavity 804. Block 1104 is optional because the external isolation structures 806 may be formed prior to and/or after the formation of the emitter pixel structure in the cavity 804 (see, e.g., block 1118 below) or may not be used at all. The external isolation structures may be, for example but not limited to, shallow trench isolation (STI) structures and/or deep trench isolation (DTI) structures. If the cavity 804 is formed in a mold layer, the mold layer material may be considered an external isolation structure and be adjusted (e.g., material selection such as dielectric or metal materials, dopants, annealing processes, etc.) to produce varying stress levels and force directions on the emitter pixel structure subsequently formed in the cavity 804 (see stress engineering examples below). In some embodiments, the mold layer may be partially removed (see, e.g., nonlimiting examples—upper portion removed 1312 or side portion removed 1314 and the like of view 1300D of FIG. 13) or completely removed (e.g., completely removed 1316 of view 1300D of FIG. 13) to produce varying stress levels on the emitter pixel structure.

Figure 9:
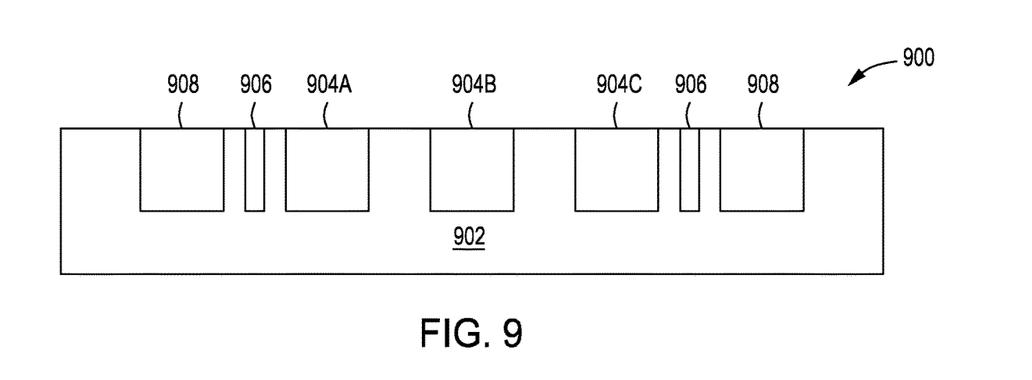
FIG. 9 depicts a cross-sectional view of a plurality of cavities surrounded by an external isolation structure in accordance with some embodiments of the present principles.

In block 1106, stress engineering is optionally performed. As discussed above, the stress engineering may be performed prior to and/or after the formation of the emitter pixel structure in a cavity. Stress engineering involves altering stresses on an emitter pixel structure to increase the emitter pixel structure's performance by increasing the emitter pixel structure's quantum efficiency. Quantum efficiency is the percentage of electrons that are converted into photons that are emitted from the emitter pixel structure. The stress and/or work-function/electric-field engineering of the emitter pixel structure may also make use of material selections used to gapfill the trenches or other isolation structures to further influence the amount of stress acting on the emitter pixel structure. The stress can be engineered to be compressive or tensile stress. The amount of stress can also be even further influenced or adjusted by curing the material in the external isolation structures, implanting dopants into the material in the external isolation structures, and/or annealing of the material in the external isolation structures, etc. The multitude of ways available (including leveraging the cavity engineering as described above) for adjusting the amount of stress acting on the emitter pixel structure allows for infinite levels of stress control (amount of stress, direction of stress forces, etc.) that is not otherwise achievable, yielding substantially higher performances for LEDs. Another technique available for stress engineering, as shown in a view 900 of FIG. 9, is to place external isolation structures 906 around a plurality of cavities 904A-C formed in a cavity layer 902. The amount of stress is adjusted differently for emitter pixel structures in cavities 904A, 904C closest to the external isolation structures 906 than emitter pixel structures in cavities 904B farthest from the external isolation structures 906. Cavities 908 outside of the external isolation structures will have diminished effects of the stress control provided by the external isolation structures as the distance away from the external isolation structures increases.

Figure 1:
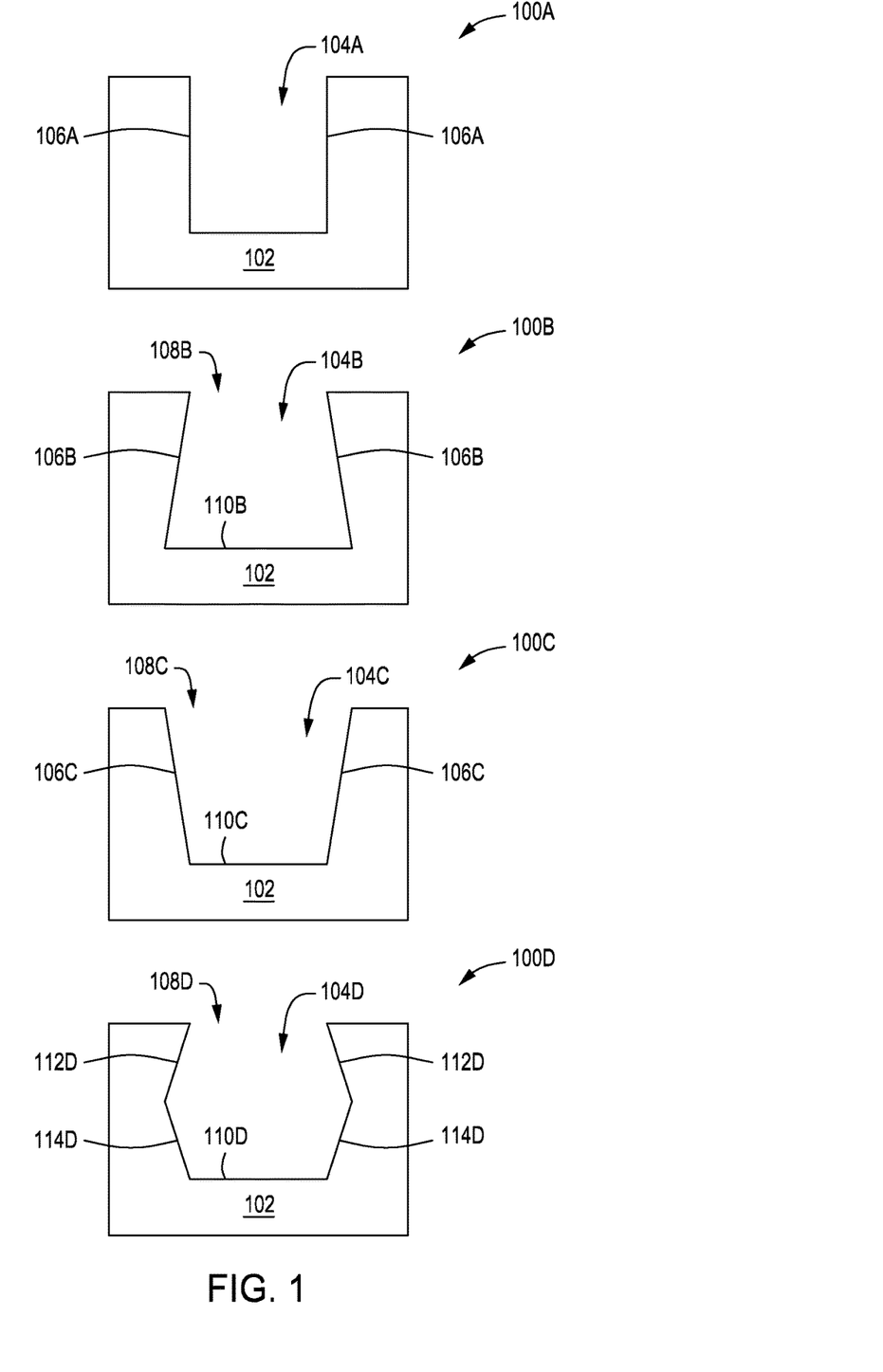
FIG. 1 depicts a cross-sectional view of a cavity with different cavity profiles in accordance with some embodiments of the present principles.
Figure 2:
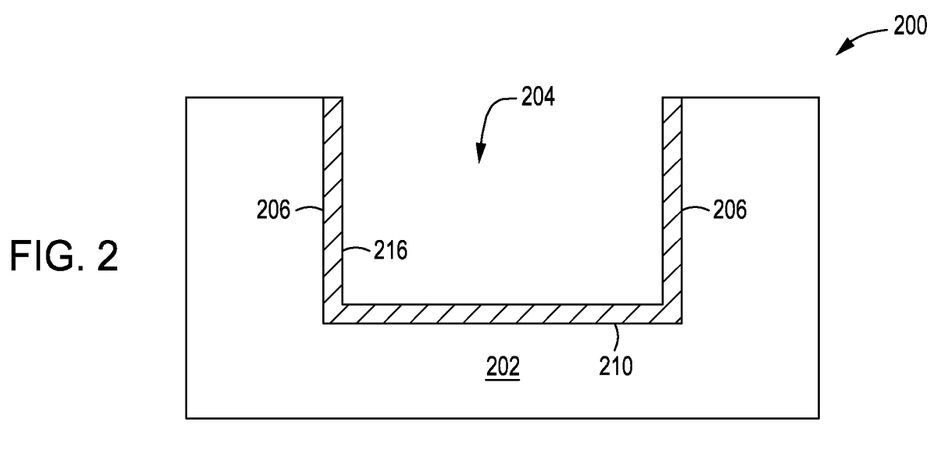
FIG. 2 depicts a cross-sectional view of a cavity with a passivation layer formed inside the cavity in accordance with some embodiments of the present principles.

In block 1108, a passivation layer 216 is formed in a cavity 204 in a cavity layer 202 as depicted in a view 200 of FIG. 2. In some embodiments, the passivation layer 216 is a conformal layer that is formed on the walls 206 and the bottom 210 of the cavity. The passivation layer 216 may have a thickness of approximately 10 angstroms to approximately 200 angstroms. The passivation layer 216 may be comprised of dopants or high k materials. After forming a cavity, surfaces of the cavity generally exhibit crystal damage caused by the processes used to form the cavity. The crystal damage or defects can be leakage paths for electrons/holes. The passivation layer serves to passivate or recombine leakage paths and improve the quantum efficiency.

Figure 3:
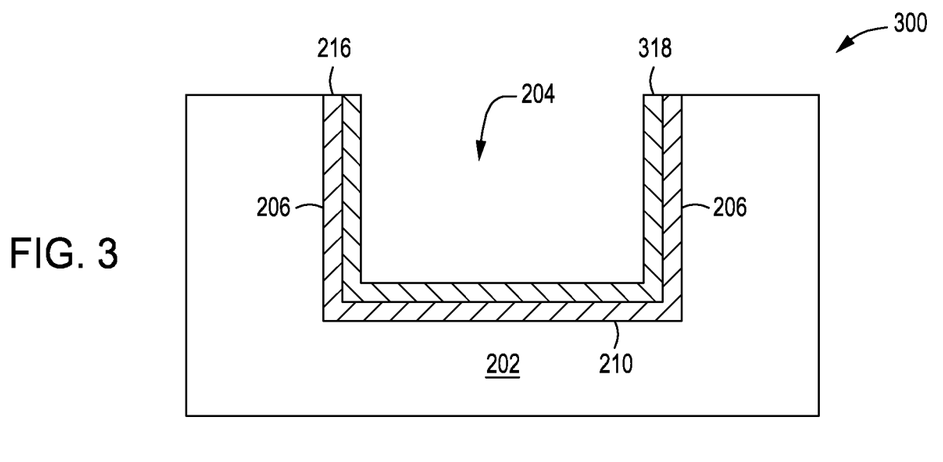
FIG. 3 depicts a cross-sectional view of a cavity with a DBR layer formed on a passivation layer in accordance with some embodiments of the present principles.

In block 1110, at least one optical layer 318 is formed in the cavity 204 of the cavity layer 202 as depicted in a view 300 of FIG. 3. In some embodiments (as shown in FIG. 3), the at least one optical layer 318 is formed on the passivation layer 216. The at least one optical layer 318 may have a thickness of approximately 50 nm to approximately 200 nm.

The at least one optical layer 318 may function as a reflective optical layer to increase a lumen output of the emitter pixel structure formed within the cavity 204. In some embodiments, the at least one optical layer 318 may be augmented through implantation or doping to also provide a charge passivation and/or a further isolation function. In some embodiments, the at least one optical layer 318 may be comprised of dielectric and/or metal material. In some embodiments, the at least one optical layer 318 may form a distributed Bragg reflector (DBR) layer. The DBR layer influences optical wavelengths by alternating layers of different materials with varying refractive indexes. Optical waves are reflected at each of the layer boundaries. Different layer configurations can be used to provide complete optical reflection as a mirror or only at certain wavelengths as a filter. In some embodiments, the at least one optical layer 318 may form a DBR filter layer to function as an optical filter to alter the wavelength (and color) output of the LED. The DBR filter layer can be used to reflect certain wavelengths of light while permitting other wavelengths of light to pass. The DBR layers may be deposited using an ALD or CVD deposition process or epitaxially grown. In some embodiments, a DBR filter layer may be optionally formed on the emitter pixel structure after the emitter pixel is formed to filter the light output of the LED.

Figure 4:
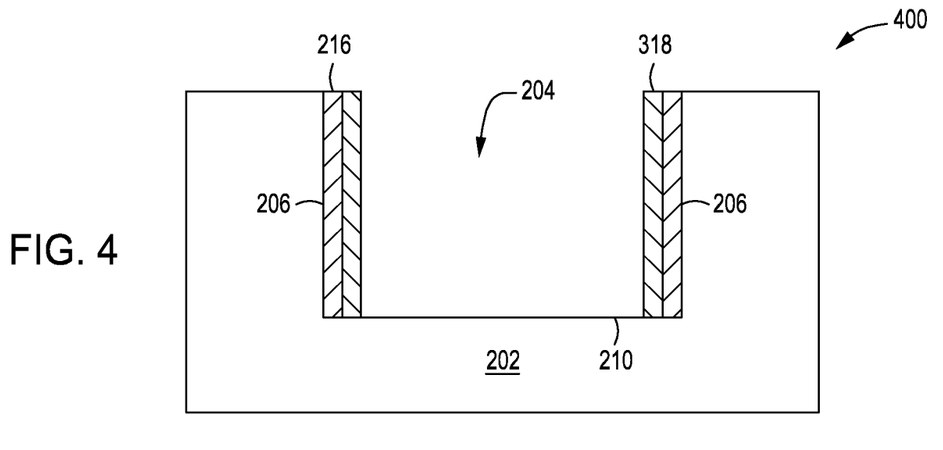
FIG. 4 depicts a cross-sectional view of a cavity with an exposed bottom surface in accordance with some embodiments of the present principles.
Figure 5:
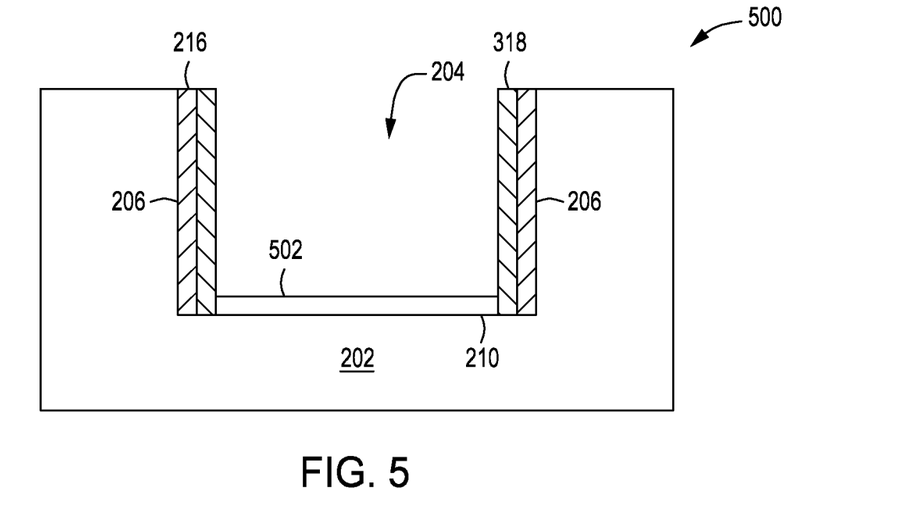
FIG. 5 depicts a cross-sectional view of a cavity with a charge passivation layer in accordance with some embodiments of the present principles.

In block 1112, the bottom 210 of the cavity 204 is optionally etched to remove any depositions from the bottom of the cavity 204 as depicted in a view 400 of FIG. 4 and a charge passivation layer 502 is optionally formed on the bottom 210 of the cavity 204 as depicted in a view 500 of FIG. 5. The bottom 210 of the cavity 204 may be etched to expose the substrate material if a subsequent emitter pixel structure formation process will use epitaxial growth. The etching during formation of the cavity 204 can cause damage to the crystal structure of the substrate material and a charge passivation layer 502 may be used to rectify the damage from the etching process. The charge passivation layer 502 serves a dual function in that the charge passivation layer 502 passivates or minimizes the crystal defects while also carrying a charge that influences the work function of the emitter pixel structure to increase the LED's quantum efficiency and/or alter the wavelength of the LED.

Figure 6:
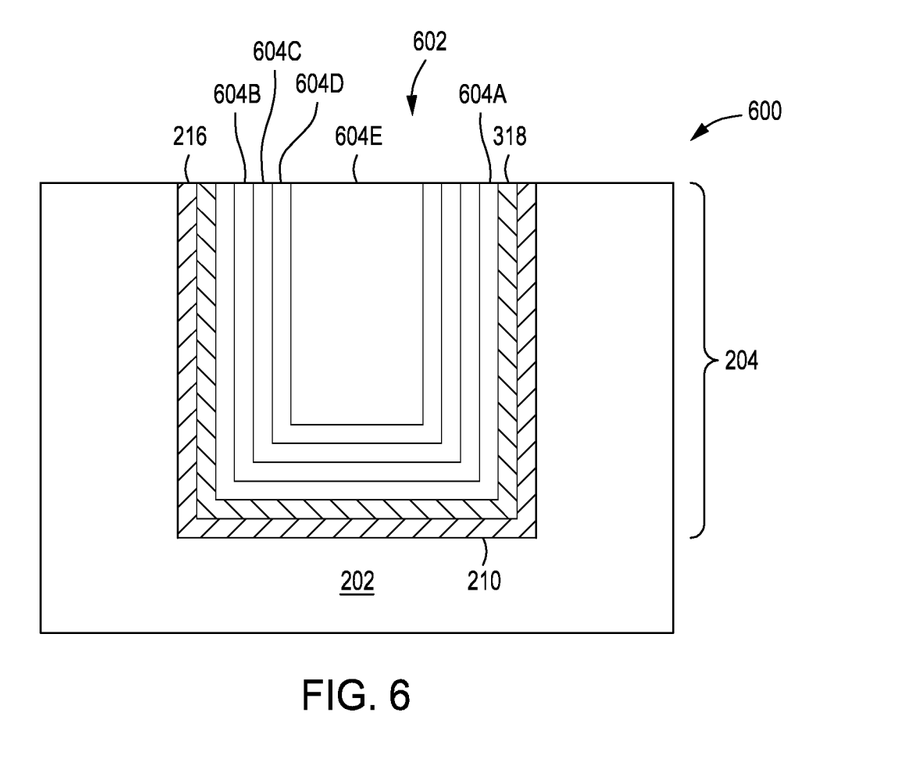
FIG. 6 depicts a cross-sectional view of an emitter pixel structure formed by deposition in accordance with some embodiments of the present principles.

In block 1114, at least one emitter pixel structure is formed in the cavity 204. In some embodiments as depicted in a view 600 of FIG. 6, the emitter pixel structure 602 is formed by, for example, ALD deposition or CVD deposition or epitaxial growth processes in a conformal manner. The "layers" 604A-E are meant to represent the compositional control over the internal structure of the emitter pixel structure 602 that is obtained by performing the method of the present principles. For example, the boundaries of the "layers" 604A-E may be dopant gradient transitions and the like. The number of "layers" may be more or less, and five layers is not meant to be limiting in any manner or to imply that the internal structure of the emitter pixel structure has distinct layers. As the emitter pixel structure 602 is deposited by deposition, various dopant gases at various rates and densities may be used to dope the deposited material with high control during a single deposition process, dramatically increasing throughput while increasing performance of the LED. In some embodiments, layer 604A may be an N-type layer and inner layer 604E may be a P-type layer. In some embodiments, layer 604A may be P-type layer and inner layer 604E may be an N-type layer. One significant advantage of the conformal formation of the emitter pixel structure 602 is that both contacts (N-type and P-type contacts) of the emitter pixel structure may be easily accessed from one side of the emitter pixel structure and at the same height, making integration of the emitter pixel structures CMOS fabrication compatible and extremely cost effective with little or no requirement for via formations during processing. Another benefit is to leverage the length difference between an outer layer 604B and an inner layer 604E in which higher mobility or longer lifetime carriers can be injected into the outer layer 604B while lower mobility or shorter lifetime carriers can be injected into the inner layer 604E (forming the emitter pixel structure with different carrier injection or diffusion lengths and junction surface areas between electrons and holes or n-type and p-type). The approach can be combined together with stress/strain and/or work-function/electric-field engineering to enable better carrier recombination and higher quantum efficiency.

Figure 7:
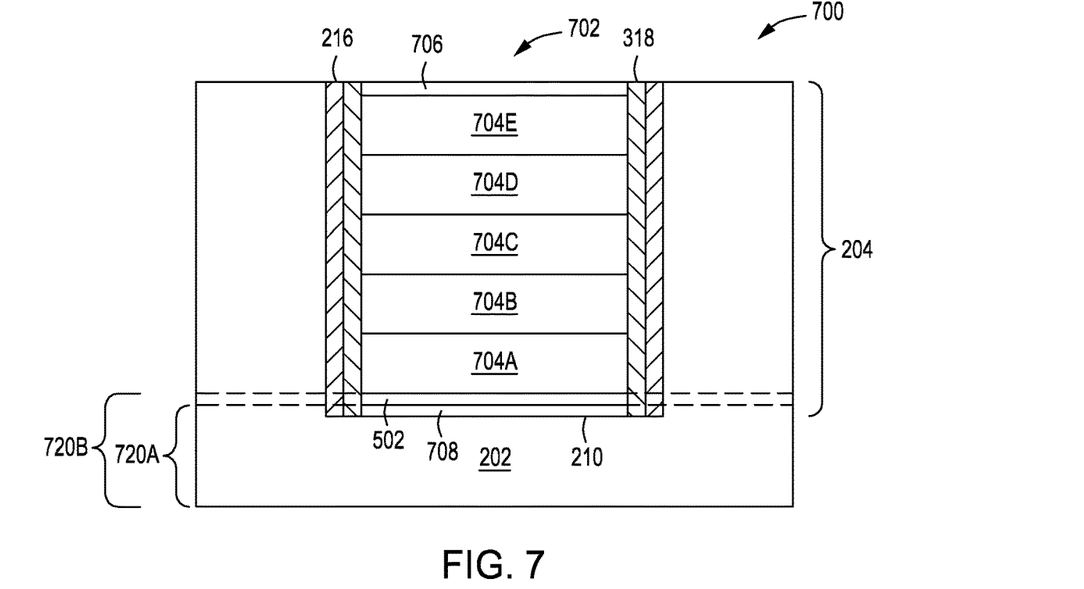
FIG. 7 depicts a cross-sectional view of an emitter pixel structure formed by epitaxial growth or other deposition techniques in accordance with some embodiments of the present principles.

In some embodiments as depicted in a view 700 of FIG. 7, the emitter pixel structure 702 is formed in a nonconformal manner by, for example, epitaxial growth using a molecular beam epitaxy (MBE) process or other deposition techniques or selective deposition processes and the like. The "layers" 704A-E are meant to represent the compositional control over the internal structure of the emitter pixel structure 702 that is obtained by performing the method of the present principles. For example, the boundaries of the "layers" 704A-E may be dopant gradient transitions and the like. The number of "layers" may be more or less, and five layers is not meant to be limiting in any manner or to imply that the internal structure of the emitter pixel structure has distinct layers. As the emitter pixel structure 702 is formed by epitaxial growth or selective deposition processes, various dopant gases at various rates and densities may be used to dope the deposited material with high control during a single epitaxial growth or selective deposition process, dramatically increasing throughput while increasing performance of the LED. In some embodiments, further stress engineering techniques may be performed during the formation of the emitter pixel structure. Materials or dopants may be selected to increase/decrease stress within the pixel structure. In some embodiments, passivation, DBR mirror/filter, isolation, and work function may be achieved as a single process during the formation of the emitter pixel structure, increasing throughput and performance while reducing costs. In some embodiments, layer 704A may be an N-type layer and layer 704E may be a P-type layer. In some embodiments, layer 704A may be P-type layer and layer 704E may be an N-type layer. In some embodiments, as mentioned above, a DBR filter layer 706 may be formed on the layer 704E of emitter pixel structure 702 to filter transmitted light from the LED. The DBR structure can also be designed as a reflector (optional DBR mirror layer 708) and integrated with the charge passivation layer 502 for more light output through the top of the emitter pixel structure 702. If the cavity layer 202 is polished (e.g., chemical mechanical polishing (CMP)) to remove a first portion 720A or a second portion 720B of the bottom of the cavity layer 202 to expose the layer 704A with layer 502 as an etching stop or to expose the charge passivation layer 502 (without formation of optional DBR mirror layer 708), the DBR filter layer 706, formed as a mirror layer, will enhance light output through the charge passivation layer 502 and out of the bottom of the emitter pixel structure 702.

In block 1116, a crystallization process is optionally performed on the emitter pixel structure. When an emitter pixel structure is deposited in a cavity as opposed to epitaxially grown, the emitter pixel structure could be in a non-crystalline form that will inhibit the emitter pixel structure's performance. By performing the crystallization process on a deposited emitter pixel structure, the dislocation or defect density of the crystals of the emitter pixel structure can be reduced, yielding a higher performing LED. The crystallization process may include subjecting the emitter pixel structure to high heat and pressure. For example, the temperature may range from approximately 400 degrees Celsius to approximately 1200 degrees Celsius, the pressure may range from approximately 1 Torr to approximately 760 Torr, and the duration may range from a few nanoseconds to approximately 1 hour. The crystallization process is optional because emitter pixel structures grown by epitaxial growth do not need crystallization to increase performance of the LED.

Figure 8:
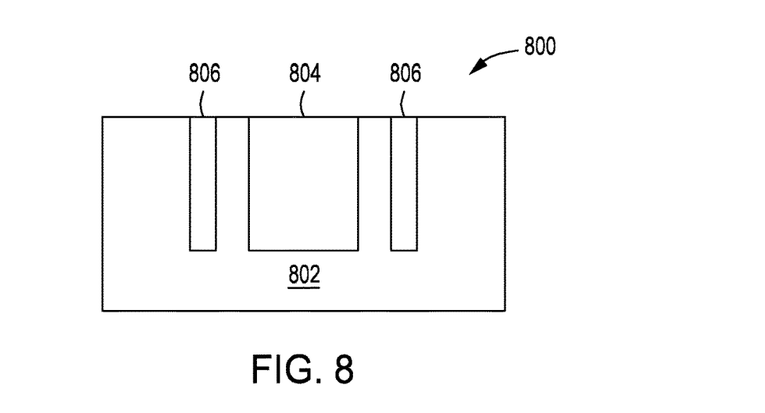
FIG. 8 depicts a cross-sectional view of a cavity surrounded by an external isolation structure in accordance with some embodiments of the present principles.

In block 1118, as shown a view 800 of FIG. 8, at least one LED external isolation structure is optionally formed near the cavity 804 formed in a cavity layer 802. The external isolation structure may be optional if the external isolation structure has been previous formed prior to the emitter pixel structure formation as described in block 1104. In some embodiments, the external isolation structure may be formed both prior to and after the formation of the emitter pixel structure and may use different types of external isolation structures (e.g., combination of shallow and deep trenches with same or different materials/treatment, etc.). As noted above, the term "external" is used for isolation structures that do not reside within the walls of the cavity. The external isolation structures 806 are used to adjust the amount of stress acting on the emitter pixel structure that is formed within the cavity 804. The external isolation structures 806 may be, for example but not limited to, shallow trench isolation (STI) structures and/or deep trench isolation (DTI) structures and the like. If the cavity 804 is formed in a mold layer, the mold layer material may be considered an external isolation structure and may be adjusted (e.g., material selection such as dielectric or metal materials, dopants, annealing processes, etc.) to produce varying stress levels and force directions on the emitter pixel structure subsequently formed in the cavity 804 (see stress engineering examples below). In some embodiments, the mold layer may be partially or completely removed to produce varying stress levels on the emitter pixel structure.

In block 1120, stress engineering is optionally performed. As discussed above, the stress engineering may be performed prior to and/or after the formation of the emitter pixel structure in a cavity. The stress engineering of the emitter pixel structure may also make use of material selections used to gapfill the trenches or other isolation structures to further influence the amount of stress acting on the emitter pixel structure. The amount of stress can also be even further influenced or adjusted by curing the material in the external isolation structures, implanting dopants into the material in the external isolation structures, and/or annealing of the material in the external isolation structures, etc. The multitude of ways available (including leveraging the cavity engineering as described above) for adjusting the amount of stress acting on the emitter pixel structure allows for fine levels of stress control that is not otherwise achievable, yielding substantially higher performances out of LEDs. Another technique available for stress engineering, as shown in FIG. 9, is to place external isolation structures 906 around a plurality of cavities 904A-C formed in a cavity layer 902. The amount of stress is adjusted differently for emitter pixel structures in cavities 904A, 904C closest to the external isolation structures 906 than emitter pixel structures in cavities 904B farthest from the external isolation structures 906. Cavities 908 outside of the external isolation structures will have diminished effects of the stress control provided by the external isolation structures as the distance away from the external isolation structures increases.

Figure 10:
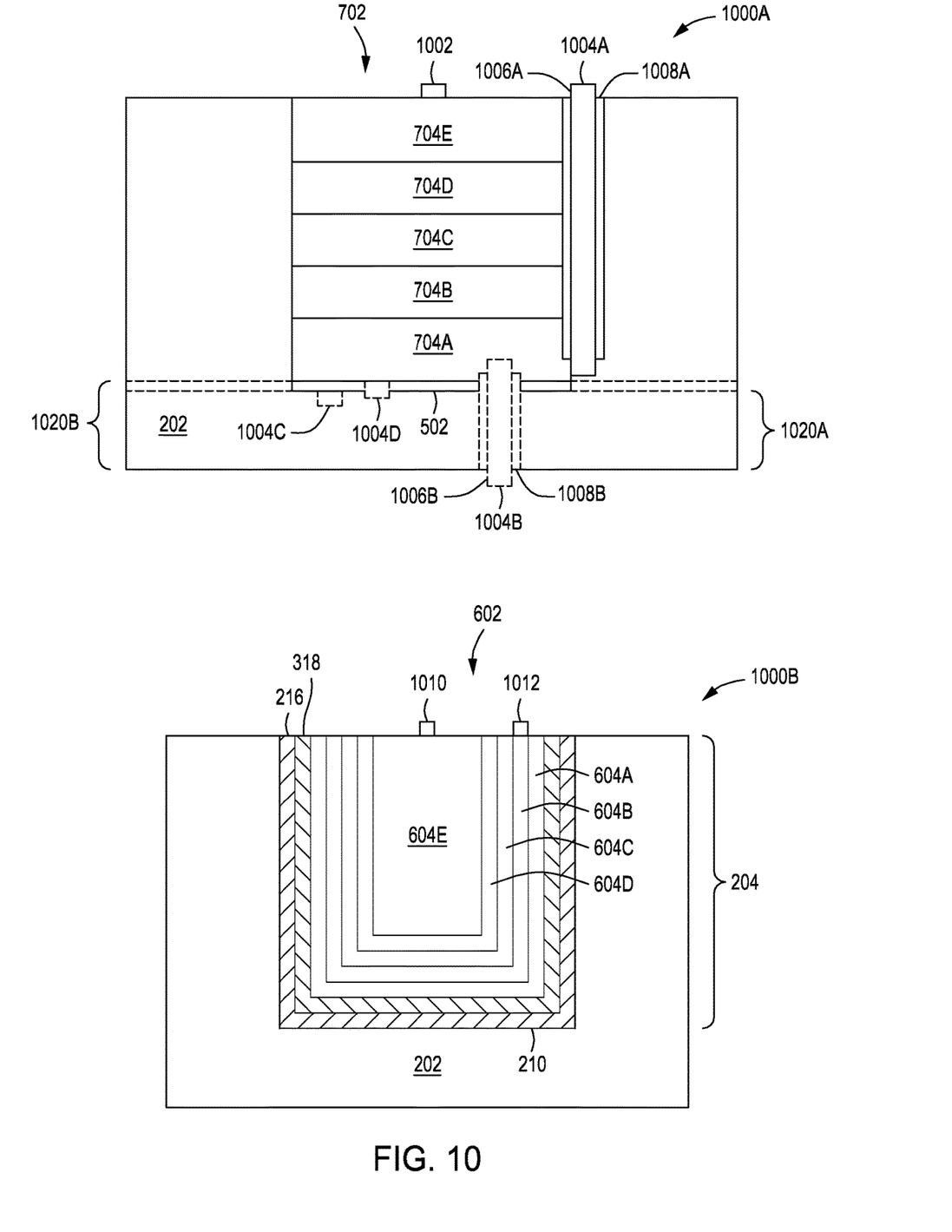
FIG. 10 depicts a cross-sectional view of contacts formed for a light emitting diode in accordance with some embodiments of the present principles.

In block 1122, contacts and/or vias are optionally formed for LED signal control as depicted in FIG. 10. In some embodiments, the emitter pixel structure 702 is formed by epitaxial growth as depicted in view 1000A of FIG. 10. A first contact 1002 may be formed on the top of the emitter pixel structure. In order to have both contacts on the same side and at the same height, a second contact 1004A is created by forming a via 1006A that extends downward to a lower portion (layer 704A) of the emitter pixel structure 702. The via 1006A may be at least partially surrounded by an electrical isolation layer 1008A. In some embodiments, the emitter pixel structure 702 may have a first contact 1002 and a second contact 1004B (in dashed lines) on opposite sides of the emitter pixel structure 702. The second contact 1004B may be created by forming a via 1006B that extends upwards to a lower portion (layer 704A) of the emitter pixel structure 702. The via 1006B may be at least partially surrounded by an electrical isolation layer 1008b if required. If the cavity layer 202 is polished (e.g., chemical mechanical polishing (CMP)) to remove a first portion 1020A of the bottom of the cavity layer 202 or to remove a second portion 1020B of the bottom of the cavity layer 202 to expose the charge passivation layer 502 or the layer 704A, respectively, the second contact 1004C, 1004D can be formed on the charge passivation layer 502 or the layer 704A, respectively, similar to the first contact 1002 without via formation. In some embodiments, the emitter pixel structure 702 is formed by a conformal deposition process described above and as depicted in view 1000B of FIG. 10. A first contact 1010 is formed on inner layer 604E and a second contact 1012 is formed on layer 604A on the same side of the emitter pixel structure 602 and at the same height. As the emitter pixel structure 602 allows for easy same height contacts, the emitter pixel structure 602 can be integrated with other semiconductor structures such as sensor pixel structures without extra processing, increasing throughput and reducing costs.

Embodiments in accordance with the present principles may be implemented in hardware, firmware, software, or any combination thereof. Embodiments may also be implemented as instructions stored using one or more computer readable media, which may be read and executed by one or more processors. A computer readable medium may include any mechanism for storing or transmitting information in a form readable by a machine (e.g., a computing platform or a "virtual machine" running on one or more computing platforms). For example, a computer readable medium may include any suitable form of volatile or non-volatile memory. In some embodiments, the computer readable media may include a non-transitory computer readable medium.

While the foregoing is directed to embodiments of the present principles, other and further embodiments of the principles may be devised without departing from the basic scope thereof.

The invention claimed is:
1. A method for forming a light emitting diode (LED), comprising:
   forming a cavity on a substrate, the cavity having a cavity profile and configured to accept an emitter pixel structure of the LED;
   forming at least one passivation layer in the cavity;
   forming at least one optical layer in the cavity on at least a portion of one of the at least one passivation layer, wherein the at least one optical layer is configured to increase a lumen output of the emitter pixel structure;
forming the emitter pixel structure in the cavity on the at least one optical layer of the emitter pixel structure,
wherein the cavity profile is configured to control stress on the emitter pixel structure by altering an electrical field or a work-function within the emitter pixel structure to increase carrier mobility and recombination efficiency and to adjust an emitted light wavelength of the emitter pixel structure; and
adjusting an amount of stress applied to the emitter pixel structure prior to or after formation of the emitter pixel structure in the cavity, wherein adjusting the amount of stress adjusts the emitted light wavelength of the emitter pixel structure, wherein the amount of stress is adjusted by placing at least one isolation structure external of the cavity of a material different from the substrate beside the cavity, wherein the amount of stress is further adjusted by differing material selections of the material different from the substrate for the external isolation structure, and wherein the at least one isolation structure is at least one shallow trench isolation structure or at least one deep trench isolation structure gapfilled with the material different from the substrate.

2. The method of claim 1 further comprising:
forming a mold layer on the substrate; and
forming the cavity on the substrate by etching the cavity in the mold layer.

3. The method of claim 1 further comprising:
forming the cavity on the substrate by etching the cavity into a substrate material.

4. The method of claim 1, further comprising:
forming the emitter pixel structure using an atomic layer deposition (ALD) process, a chemical vapor deposition (CVD) process, or a molecular beam epitaxy (MBE) process; and
crystallizing the emitter pixel structure.

5. The method of claim 1, wherein the at least one passivation layer or the at least one optical layer is conformally deposited into the cavity.

6. The method of claim 1, wherein the at least one optical layer includes a distributed Bragg reflector (DBR) mirror layer.

7. The method of claim 1, further comprising:
depositing a charge passivation layer in the cavity prior to forming the emitter pixel structure, the charge passivation layer configured to further adjust the emitted light wavelength.

8. The method of claim 1, wherein the amount of stress is further adjusted by curing processes, implanting dopants, or annealing processes prior to or after forming the emitter pixel structure.

9. The method of claim 1, further comprising:
etching a bottom of the cavity to reveal substrate material; and
forming the emitter pixel structure in the cavity using an epitaxial growth process.

10. The method of claim 1, wherein the optical layer is formed of a metal material or dielectric material.

11. A method for forming a light emitting diode (LED), comprising:
forming a cavity on a substrate, the cavity having a cavity profile and configured to accept an emitter pixel structure of the LED;
forming a passivation layer in the cavity, wherein the passivation layer has a thickness of approximately 10 angstroms to approximately 200 angstroms and is configured to recombine leakage paths for electrons or holes in a surface of the cavity;
forming an optical layer in the cavity on at least a portion of the passivation layer, wherein the optical layer has a thickness of approximately 50 nanometers to approximately 200 nanometers; and
forming the emitter pixel structure in the cavity on the optical layer of the emitter pixel structure, wherein the emitter pixel structure has direct contacts to the emitter pixel structure on a same side and at a same height.

12. The method of claim 11, further comprising:
adjusting an amount of stress applied to the emitter pixel structure prior to or after formation of the emitter pixel structure in the cavity by placing at least one isolation structure external to the cavity and of a material different from the substrate beside the cavity, wherein the at least one isolation structure is at least one shallow trench isolation structure or at least one deep trench isolation structure.

13. The method of claim 11, wherein the emitter pixel structure is conformally formed with an inner layer with a first length shorter than an outer layer with a second length and wherein higher mobility or longer lifetime carriers are injected into the outer layer while lower mobility or shorter lifetime carriers are injected into the inner layer.

14. The method of claim 11, wherein the optical layer is augmented by doping or implantation to provide charge passivation or isolation of the emitter pixel structure.

15. The method of claim 11, further comprising:
forming the emitter pixel structure with different carrier injection or diffusion lengths and junction surface areas between electrons and holes or n-type and p-type.

16. The method of claim 11, further comprising:
forming a mold layer on the substrate; and
forming the cavity into the mold layer; or
forming the cavity by etching the substrate.

17. The method of claim 11, further comprising:
forming the emitter pixel structure using an atomic layer deposition (ALD) process or a chemical vapor deposition (CVD) process, or a molecular beam epitaxy (MBE); and
crystallizing the emitter pixel structure.

18. The method of claim 11, further comprising:
adjusting an amount of stress applied to the emitter pixel structure by altering a combination of the cavity profile and a composition of the emitter pixel structure.

19. A non-transitory, computer readable medium having instructions stored thereon that, when executed, cause a method for forming a light emitting diode (LED) to be performed, the method comprising:
forming a cavity on a substrate, the cavity having a cavity profile and configured to accept an emitter pixel structure of the LED;
forming a passivation layer in the cavity, wherein the passivation layer has a thickness of approximately 10 angstroms to approximately 200 angstroms and is configured to recombine leakage paths for electrons or holes in a surface of the cavity;
forming an optical layer in the cavity on the passivation layer, wherein the optical layer has a thickness of approximately 50 nanometers to approximately 200 nanometers; and
forming the emitter pixel structure in the cavity on the optical layer of the emitter pixel structure, wherein the emitter pixel structure has direct contacts to the emitter pixel structure on a same side and at a same height.

20. The non-transitory computer readable medium of claim 19, wherein the method further comprises:
adjusting an amount of stress applied to the emitter pixel structure prior to or after formation of the emitter pixel structure in the cavity by placing at least one isolation structure external to the cavity and of a material different from the substrate beside the cavity, wherein the at least one isolation structure is at least one shallow trench isolation structure or at least one deep trench isolation structure.

* * * * *